United States Patent [19]

Köpke et al.

[11] 4,395,601
[45] Jul. 26, 1983

[54] MODULAR HEARING AID

[75] Inventors: Wolfgang Köpke; Manfred Müller; Wolfgang Schmidt; Albert Eggert; Erwin Gahleitner; Gerhard Raupach, all of Berlin, Fed. Rep. of Germany

[73] Assignee: Robert Bosch GmbH, Stuttgart, Fed. Rep. of Germany

[21] Appl. No.: 192,256

[22] Filed: Sep. 30, 1980

[30] Foreign Application Priority Data

Oct. 17, 1979 [DE] Fed. Rep. of Germany ....... 2941951

[51] Int. Cl.³ .................. H04R 25/04; H05K 1/00
[52] U.S. Cl. ............................. 179/179; 179/107 R; 339/17 C; 339/17 LC; 339/17 LM; 339/17 M
[58] Field of Search .......... 179/107 E, 107 H, 107 S, 179/178, 179; 339/17 LM, 17 M, 17 L, 17 LC, 17 C

[56] References Cited

U.S. PATENT DOCUMENTS

| | | | |
|---|---|---|---|
| 2,648,031 | 8/1953 | Lang et al. | 339/17 C |
| 2,856,466 | 10/1958 | Gustafson et al. | 179/107 S |
| 3,265,819 | 8/1966 | Herrmann | 179/107 E |
| 3,270,251 | 8/1966 | Evans | 339/17 M |
| 3,283,060 | 11/1966 | Wiese | 339/17 C |
| 3,553,634 | 1/1971 | Lundergan et al. | 339/17 LM |
| 3,778,681 | 12/1973 | Wilson | 339/17 LC |
| 3,781,764 | 12/1973 | Johnson | 339/17 M |
| 4,054,345 | 10/1977 | Sherwood | 339/17 M |
| 4,133,592 | 1/1979 | Cobaugh et al. | 339/17 M |

FOREIGN PATENT DOCUMENTS

| | | | |
|---|---|---|---|
| 232997 | 2/1961 | Australia | 339/17 M |
| 7225080 | 5/1972 | Fed. Rep. of Germany . | |
| 1111887 | 5/1968 | United Kingdom | 179/107 R |

OTHER PUBLICATIONS

IBM Technical Disclosure Bulletin, vol. 6, No. 3, Aug. 1963, Standoff or Microminiature Circuit–Stricker et al., pp. 15–16.

Primary Examiner—George G. Stellar
Attorney, Agent, or Firm—Spencer & Kaye

[57] ABSTRACT

A hearing aid has a circuit board having conductor strips thereon; first plug-in elements mounted on the circuit board and being electrically connected to selective conductor strips; a plurality of circuit board-supported modular structural units; and second plug-in elements mounted on each circuit board-supported modular structural unit. The first plug-in elements cooperate with respective second plug-in elements for securing selected circuit board-supported modular structural units on the circuit board.

8 Claims, 2 Drawing Figures

MODULAR HEARING AID

BACKGROUND OF THE INVENTION

This invention relates to a hearing aid which has a circuit board serving as a carrier for conductor strips as well as for electric and mechanical structural elements and stages.

German Utility Patent Model (Gebrauchsmuster) No. 7,225,080 discloses a portable hearing aid of the above-outlined type. The configuration and dimensions of the circuit board are selected in such a manner that the circuit board is adapted for use in only one particular hearing aid type with a predetermined acoustic amplification and predetermined possibilities of regulation (for example, peak clipping and tone control).

SUMMARY OF THE INVENTION

It is an object of the invention to provide an improved hearing aid of the above-outlined type which has a significantly increased versatility.

This object and others to become apparent as the specification progresses, are accomplished by the invention, according to which, briefly stated, there is provided a main circuit board which has a plurality of plug and/or socket elements as well as circuit board-supported modular structural units carrying prongs and/or sockets. The dimensions of the modular units are so selected that one or more such unit may be selectively positioned on the main circuit board and plugged into the respective prong and/or socket terminals forming part of the main circuit board.

The hearing aid according to the invention has the advantage that by providing different modular plug-in circuit board units, a great number of hearing aid types may be constructed from the appropriately selected combination of the structural units. For example, the hearing aid circuit may be composed of circuit board-supported modular units such as a preamplifier, a tone adjusting unit and a power amplifier, respectively. All these circuit components are thus supported on their own circuit board base which, in turn, is plugged into the main circuit board. By virtue of the fact that each circuit board-supported modular structural unit is available in two variants, the number of combinations that may be assembled would practically cover all types of hearing impediments and thus an optimally adapted hearing aid may be assembled. It is a further advantage of the invention that the modular, circuit board-supported plug-in structural units significantly simplify testing, tuning and repairing work.

According to a further feature of the invention, the elongated, circuit board-supported structural units each have, in their end zones, a holder for supporting additional electric components. Such additional electric components are, for example, adjustable resistors such as potentiometers or electric outlet sockets for the plug of an earphone cord. The controls of the adjustable resistors or potentiometers and the inlet opening of the outlet box lie along the outer sides of the circuit board-supported modular units so that, when the main circuit board is plugged into the hearing aid housing, the controls are accessible for manipulation through an opening in the housing.

DESCRIPTION OF THE PREFERRED EMBODIMENT

Figure 1:
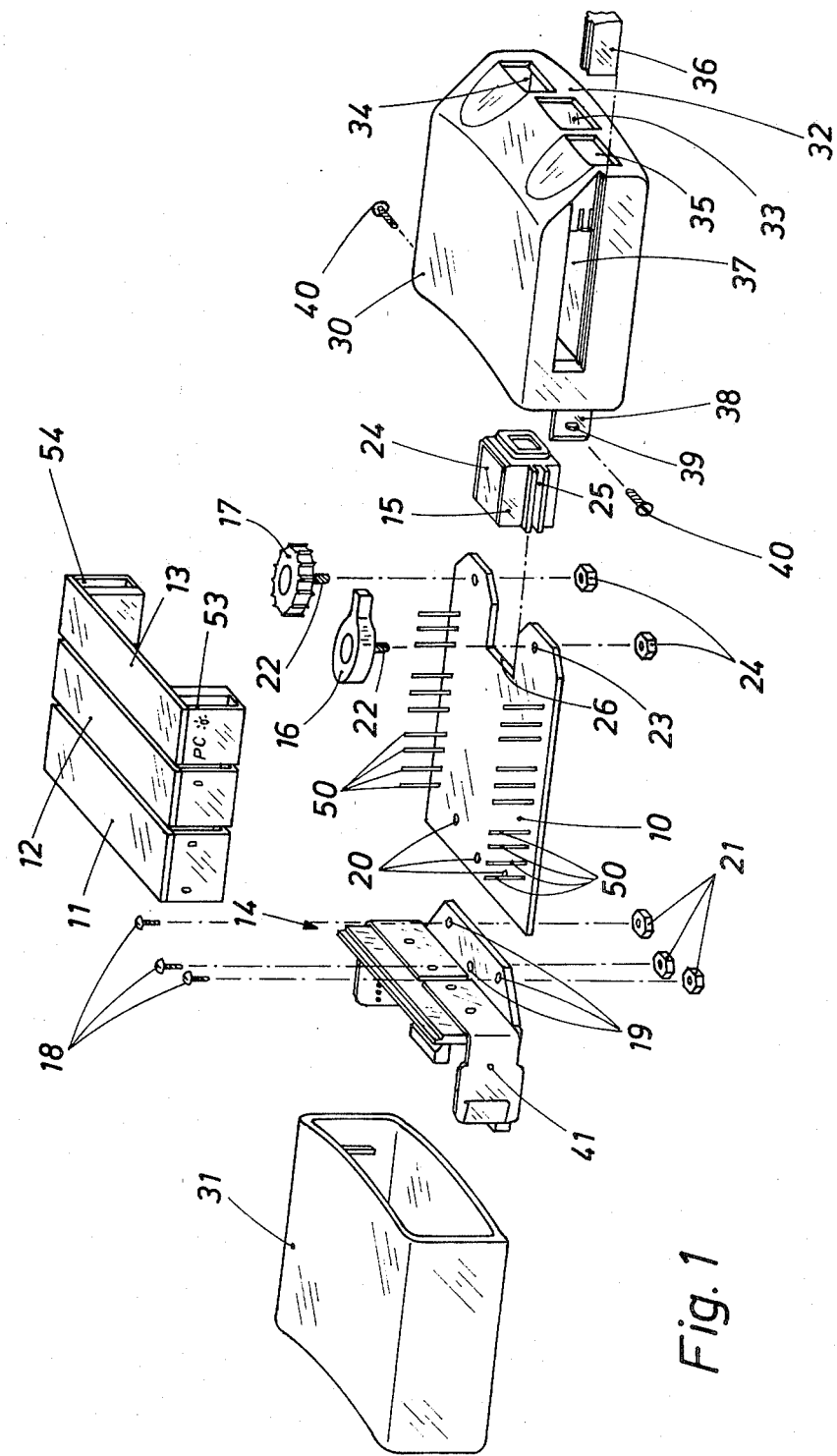
FIG. 1 is a perspective exploded view of a preferred embodiment of the invention.

Turning now to FIG. 1, the basic component of the hearing aid according to the invention is a main circuit board 10 which serves as a carrier for the circuit board-supported structural units 11, 12 and 13, as well as for a battery holder 14, a microphone unit 15, a switch 16 and an adjustable resistor 17 (hereafter adjuster). The battery holder 14 is secured to the main circuit board 10 by means of screws 18, the shafts of which pass through openings 19 provided in the battery holder 14 and openings 20 provided in the main circuit board 10. Or, in the alternative, rivets (preferably of the hollow type) may be used. For mounting the switch 16 and the adjuster 17, to both components there are fixedly attached threaded pins 22 which extend through respective openings 23 in the main circuit board 10 and are tightened by nuts 24 at the underside of the main circuit board 10. The microphone unit 15 has, on two oppositely located external sides, a guiding groove 25 into which extend edge zones of the main circuit board 10 as the microphone unit 15 is pushed into the cutout 26 of the main circuit board 10.

In the assembled state the main circuit board 10 is, together with the plugged-in or otherwise attached structural elements and structural units, surrounded by a hearing aid housing which is formed of a housing portion 30 and a closure cap 31. The housing portion 30 has, in an end face 32, openings 33, 34 and 35 through which the controls for the switch 16 and the adjuster 17 project and which furthermore provide for the sound inlet for the microphone 15.

Further, the housing portion 30 has at least one elongated opening 37 which can be closed off by a slide 36 and the purpose of which will be discussed below. On opposite small sides of the housing portion 30 there are provided tabs 38 (only one shown), each provided with a respective opening 39. Screws 40 are introduced into the openings 40 and screwed into aligned openings 41 of the battery holder 14 for securing the earlier-introduced, fully equipped main circuit board 10 in the housing portion 30.

The circuit board-supported structural units 11, 12 and 13 are narrow, U-shaped or bridge-shaped plug-in assemblies, the structure of which will now be discussed in conjunction with FIG. 2, in which, by way of example, the unit 13 is illustrated.

Thus, the unit 13 comprises a narrow, elongated rectangular secondary circuit board 45 whose width b may vary according to the desired equipment supported thereon. For a preamplifier, a tone control unit and a power amplifier of the hearing aid there are thus provided respective preselected circuit boards 45 and each type of printed board-supported unit may be available in several variants.

The secondary circuit board 45 supports, in each end zone thereof, a block 46 and 47, each containing an electric socket 48. The respective sockets 48 are so arranged that they are adapted to cooperate with corresponding prongs 50 provided on the main circuit board 10 in series that extend parallel to two opposite sides of the generally rectangular main circuit board. For securing the blocks 46 and 47 to the elongated circuit board 45 there are provided pins 49 which are connected with the sockets 48 and which fit into corresponding holes 51 provided in the circuit board 45 and which are electrically connected with the conductor strips on the circuit board, for example, by soldering.

Figure 2:
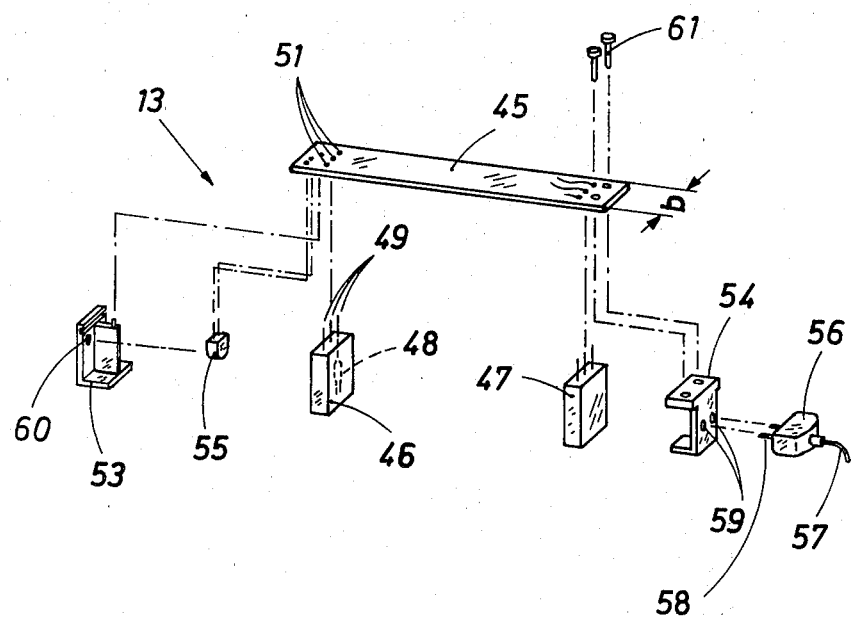
FIG. 2 is a perspective exploded view of one component shown in FIG. 1.

The blocks 46 and 47 are, according to the embodiment shown in FIG. 2, slightly recessed from the respective terminal edges of the elongated circuit board 45 (as it may also be observed in FIG. 1), so that the circuit board can carry, adjacent the respective block, one or two adjustable resistors 55 or a terminal socket 54 receiving for example, a two-pole plug 56 of a hearing aid cord 57. The terminal socket 54 has two openings through which the prongs 58 of the plug 56 may pass. The terminal socket 54 is connected by means of rivets 61 or by means of screws with the circuit board 45.

In front of an adjustable resistor 55 there is arranged a cover 53 provided with an opening 60 for allowing passage of an adjusting tool for each resistor. It may be advantageous to secure the adjustable resistors by means of holding clamps (not shown) in a snap-in manner on the block 46 to thus provide for a simple replacement of the resistor.

The cover 53 and the terminal sockets 54 are dimensioned such that the openings 60 of the cover 53 and the openings 59 of the terminal sockets 54 are accessible freely through the lateral housing opening 37.

It will be understood that the above description of the present invention is susceptible to various modifications, changes and adaptations, and the same are intended to be comprehended within the meaning and range of equivalents of the appended claims.

What is claimed is:

1. A hearing aid comprising in combination
    (a) a circuit board having conductor strips thereon, a first side and an opposite second side and an edge zone along said first side; said second side including a cutout bounded by border edges;
    (b) first plug-in elements mounted on said circuit board externally of said edge zone and being electrically connected to selective conductor strips;
    (c) a plurality of circuit board-supported modular structural units;
    (d) second plug-in elements mounted on each said circuit board-supported modular structural unit; said first plug-in elements cooperating with respective second plug-in elements for securing selected said circuit board-supported modular structural units on said circuit board;
    (e) a battery holder mounted on said edge zone for receiving a battery for the hearing aid; and
    (f) a microphone unit having opposite side faces and means defining a groove on each said side face; said microphone unit being received in said cutout and supported by said circuit board by an interengagement between each said groove and a respective said border edge.

2. A hearing aid as defined in claim 1, wherein said first and second plug-in elements are sockets and prongs cooperating with one another.

3. A hearing aid as defined in claim 1, further comprising a switch and an adjusting resistor mounted on said circuit board on either side of said cutout.

4. A hearing aid as defined in claim 1, wherein said circuit board has a substantially rectangular shape; further wherein said first plug elements are arranged in series extending parallel to said first and second sides; further wherein said modular structural units are elongated and each has an elongated secondary circuit board having opposite longitudinal ends; a separate circuit component mounted on the respective secondary circuit board; and block members mounted on said opposite longitudinal ends of said secondary circuit board; and further wherein said second plug-in elements are mounted on said block members of each said circuit board-supported modular structural unit.

5. A hearing aid as defined in claim 4, wherein said block members are situated at a distance from an adjacent said longitudinal end of said secondary circuit board; and further comprising additional circuit components carried on said secondary circuit board between the respective longitudinal end thereof and the respective said block member.

6. A hearing aid as defined in claim 5, wherein one of said additional circuit components is a potentiometer.

7. A hearing aid as defined in claim 5, further comprising a hearing aid cord having a plug; and further wherein one of said additional circuit components is an outlet box for receiving the plug of said cord.

8. A hearing aid as defined in claim 5, further comprising a cover member carried by said secondary circuit board at a longitudinal end for outwardly shielding an adjacent said additional circuit component; said cover member having an opening for allowing passage of a setting tool to said adjacent additional circuit component.

* * * * *